United States Patent [19]

Fukuda et al.

[11] Patent Number: 4,924,280
[45] Date of Patent: May 8, 1990

[54] SEMICONDUCTOR FET WITH LONG CHANNEL LENGTH

[75] Inventors: Yasuhiro Fukuda; Shooji Kitazawa, both of Tokyo, Japan

[73] Assignee: Oki Electric Industry Co., Ltd., Tokyo, Japan

[21] Appl. No.: 403,026

[22] Filed: Sep. 1, 1989

Related U.S. Application Data

[63] Continuation of Ser. No. 96,529, Sep. 15, 1987, abandoned.

[30] Foreign Application Priority Data

Jan. 23, 1987 [JP] Japan ................................ 62-12290

[51] Int. Cl.$^5$ ............................................. H01L 29/78
[52] U.S. Cl. ................. 357/23.8; 357/23.11; 357/23.13; 357/51
[58] Field of Search ...................... 357/23.1, 23.13, 51, 357/23.8, 23.11

[56] References Cited

U.S. PATENT DOCUMENTS 3,673,427  6/1972  McCoy et al. ............... 357/23.13 X
4,743,566  5/1988  Bastiaens et al. ............ 357/23.11 X

FOREIGN PATENT DOCUMENTS 0055552  7/1982  European Pat. Off. ......... 357/23.13
53-121579 10/1978  Japan.
121579 10/1978  Japan.
54-124686  9/1979  Japan ............................... 357/23.11
58-123763  7/1983  Japan ............................... 357/23.13
58-161374  9/1983  Japan ............................... 357/23.13
73375  4/1985  Japan.

OTHER PUBLICATIONS

Fukuda et al, "ESD Protection Network Evaluation by HMB and CDM(Charged Package Method)," *1986 EOS/ESD Symposium Proceedings*, pp. 193–199, Sep. 23, 1986.
1984 IEEE/IRPS, "Snapback Induced Gate Dielectric Breakdown in Graded Junction MOS Structures," pp. 165–168, Shabde et al., 1984.

*Primary Examiner*—William Mintel
*Attorney, Agent, or Firm*—Spencer & Frank

[57] ABSTRACT

In a semiconductor device having an external input terminal, a first insulated-gate field-effect transistor formed on a semiconductor substrate, and having a gate connected to the input terminal, and a second insulated-gate field effect transistor having a drain connected to the gate of the first insulated-gate field-effect transistor, and having a gate and source connected to a reference voltage source, the ratio W/L of the channel width W to the channel length L of the second insulated-gate field effect transistor is not less than 12.

4 Claims, 8 Drawing Sheets

PRIOR ART FIG.1
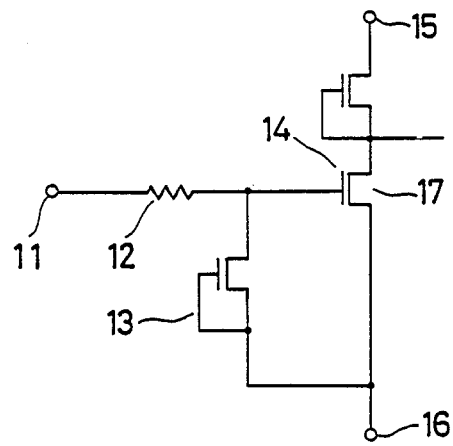
PRIOR ART FIG.2
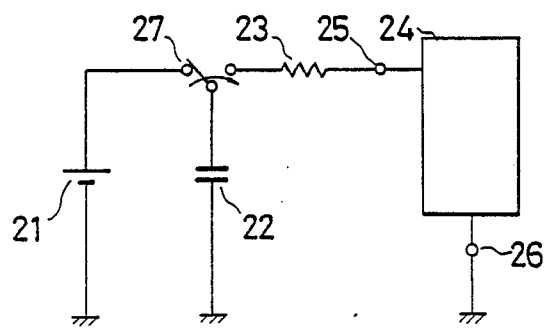

PRIOR ART  FIG. 3
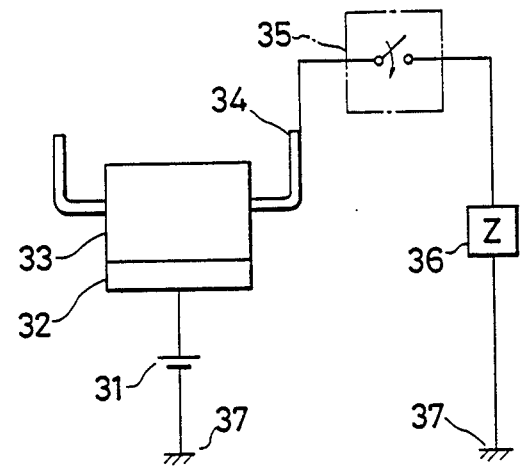
PRIOR ART  FIG. 4
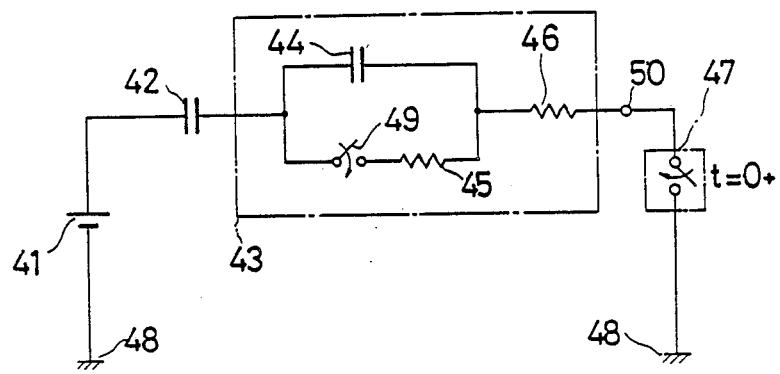

PRIOR ART FIG.5
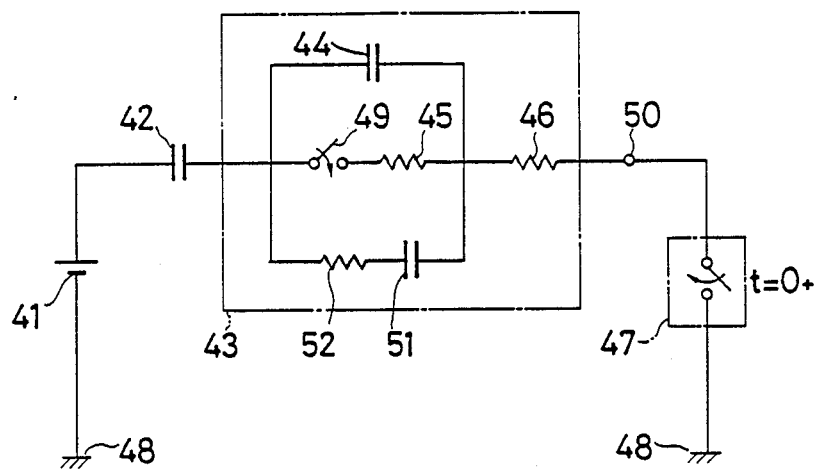
FIG.7
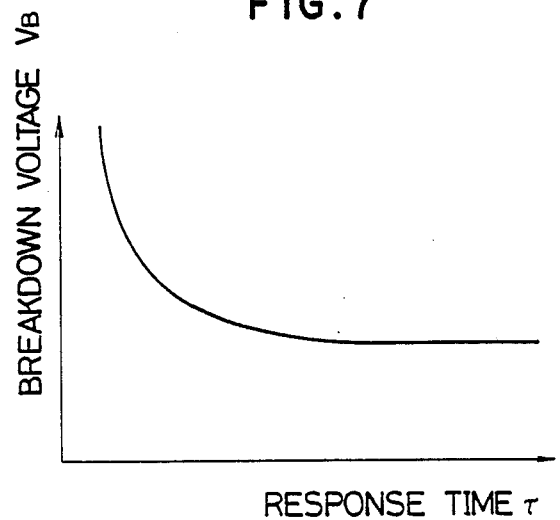

SEMICONDUCTOR FET WITH LONG CHANNEL LENGTH

This application is a continuation of application Ser. No. 07/096,519, filed Sept. 15th, 1987, now abandoned.

BACKGROUND OF THE INVENTION

The present invention relates to a semiconductor device, particularly to prevention of dielectric breakdown of an input gate in an insulated-gate field-effect transistor device.

An example of such technology in the prior art is shown in Japanese Patent Application laid-open Pub. No. 121579/1978.

FIG. 1 shows a prior art insulated-gate field-effect semiconductor device with a scheme for preventing dielectric breakdown of the gate insulator film. The device includes an input terminal 11, an input protection resistor 12, a protection transistor 13, an input gate 14, a power supply terminal (Vcc) 15, a ground (GND) power supply terminal 16, and a transistor 17 to be protected. To simplify the description here, the input protection resistor 12 is shown to be formed of a polysilicon layer. Where the input protection resistor is formed of a doped (impurity-diffused) silicon layer, it can be regarded as a combination of a resistor component and a diode in parallel with each other.

FIG. 2 shows an arrangement for conducting human-body discharge for measuring dielectric breakdown voltage of a semiconductor device in the prior art, in which 21 denotes a power supply that is applied, 22 denotes a human-body equivalent capacitance, 23 denotes a discharge resistor, 24 denotes an object of the test, 25 denotes a terminal to be tested, 26 denotes a power supply or ground (GND) terminal, 27 denotes a switch mechanism. The human-body discharging method test is a test that simulates a situation where the human-body that is charged touches the external input terminal (the terminal to be tested) of the semiconductor device (the object of the test) causing a discharge through the input terminal into the internal circuit of the semiconductor device.

FIG. 3 shows an arrangement for conducting the charged package method test for measuring dielectric breakdown of a semiconductor device in the prior art, in which 31 denotes a power supply to be applied, 32 denotes a metal electrode, 33 denotes a testing object, 34 denotes a terminal to be measured, 35 denotes a switch means, 36 denotes an equivalent impedance for the object through which the discharge occurs, and 37 denotes a ground terminal.

The charged package method test based on the charged device model is a test that simulates a situation where electric charge accumulated on the surface of the package (insulator) of the semiconductor device due for example to friction is discharged by contacting the device pin to a conductor causing a dielectric induction current through the external input terminal into the internal circuitry of the semiconductor device.

Examples of the techniques shown in FIG. 2 and FIG. 3 are described in Japanese Patent Application laid-open Pub. No. 73375/1985.

In the past, the human-body discharge method of FIG. 2 was often adopted. But recently, it has been confirmed that the evaluation by the charged package method of FIG. 3 has a greater similarity to the phenomenon of dielectric breakdown which occurs in the market.

It is therefore urgently required to improve the dielectric breakdown voltage as determined by the charged package method.

FIG. 4 is an equivalent circuit diagram of an arrangement for implementing the breakdown test by the charged package method.

In FIG. 4, 41 denotes a power supply to be applied (corresponding to the power supply 31 in FIG. 3), 42 denotes a package capacitance that is the capacitance between the conductors within the IC package and the surface of the IC package where electric charges are accumulated. An oxide film capacitance 44 is shown that is the sum of the capacitance between the gate and the drain of the protection transistor 13 in FIG. 1 and the oxide film capacitance of the input gate 14 of the transistor 17 to be protected. An ON-resistance or punch-through resistance 45 of the protection transistor is shown which corresponds to the protection transistor 13 in FIG. 1. An input protection resistor 46 which corresponds to the input protection resistor 12 is also shown. A switch means 47 is shown which corresponds to the switch means 35 in FIG. 3. A ground terminal 48 is shown which corresponds to the ground terminal 37 in FIG. 3. A protection transistor 49 is shown which corresponds to the protection transistor 13 in FIG. 1. The response time t of the protection transistor 49 is $\tau$. An equivalent impedance Z of the body through which the discharging current flow (the equivalent impedance 36 in FIG. 3) is omitted (short-circuited) from FIG. 4. This is justified where the dielectric breakdown in the semiconductor device in an automatic assembly machine is a discharge from the input or output terminal to the housing of the assembly machine.

If the switch means 47 in FIG. 4 is turned on at $t=0$, the voltage Vox (t) applied on the oxide film capacitance 44 is given by:

(i) for $0 \leq t < \tau$ $$Vox(t) = \frac{Cp}{Cox + Cp} \cdot V \cdot \left\{ 1 - E^{-\frac{t}{R}(\frac{1}{Cox} + \frac{1}{Cp})} \right\} \quad (1)$$

(ii) for $t \geq \tau$ $$Vox(t) = A\{1 - E^{-a(t-\tau)}\} - B\{1 - E^{-b(t-\tau)}\} + \frac{Qo}{Cox} \quad (2)$$

$$Qo = \frac{Cp \, Cox}{Cp + Cox} \cdot V \cdot \left\{ 1 - E^{-\frac{t}{R}(\frac{1}{Cp} - \frac{1}{Cox})} \right\} \quad (3)$$

Here, V represent the applied voltage, Cp represents the package capacitance, Cox represents the oxide film capacitance, R represents the input protection resistance, Qo represents the charge accumulated on the oxide film capacitance Cox at time $t=\tau$, and a, b, A and B represent having the constants determined by the circuit constants.

In the charged package method, the breakdown occurs almost exclusively at the gate oxide film at the input gate of the transistor 17 or the protection transistor 13.

Breakdowns at oxide films are generally electric field breakdowns, which are dependent on the maximum value of the voltage Vox applied on the oxide film capacitance 44. As will be understood from the expressions (1), (2) and (3) above, the voltage Vox assumes the maximum value at time t=τ. The voltage at which the oxide film breaks is unchanged if the film quality and film thickness are unchanged. The voltage $V_B$ that is required to make Vox (τ) to be the oxide film breakdown voltage Vox b is given by:

$$V_B = \frac{C_{ox} + C_p}{C_p} \cdot \frac{V_{oB}}{\left(1 - E^{-\frac{\tau}{R}(\frac{1}{C_{ox}} + \frac{1}{C_p})}\right)} \quad (4)$$

Here, $V_B$ is called the breakdown voltage, and — represents the response time of the protection transistor 13.

As was mentioned earlier, improvement for breakdown voltage as determined by the charged package method has not been studied. Rather, the study has been made to improve the breakdown voltage as determined by the human body discharge method shown in FIG. 2. In the protection circuit of FIG. 1, the breakdown occurs almost exclusively at the input protection resistor 12 in the form of fusion. To improve the breakdown voltage, it has been attempted to enlarge the input protection resistance thereby to reduce the power consumption. If the input protection resistance is enlarged, the breakdown voltage as determined by the charged package method is also improved as will be seen from equation (4). Another factor to be considered is that the gate oxide film and the field oxide film are made thinner and thinner, in line with advancement of the degree of integration of the semiconductor device. The reduction in the gate oxide film thickness leads to reduction in Voxb in equation (4) and hence reduction in the breakdown voltage as determined by the charged package method.

Effect of the reduction in the thickness of the field oxide film will be explained below:

FIG. 5 shows an equivalent circuit of a circuit used for the charged package method taking account of the capacitance due to the field oxide film. The components identical to those in FIG. 4 are shown with identical reference numerals. The field oxide film capacitance 51 whose value is denoted by Cf is increased with reduction in the thickness of the field oxide film, so that the voltage Vf (t) as applied to the field oxide film capacitance is decreased. However, the breakdown voltage of the field oxide film is reduced to a greater degree. As a result, the voltage $V_B$ that is required to cause the field oxide breakdown is lowered. If the input protection resistance 46 is increased, the response time τ of the protection transistor is increased. As a result, the maximum value of the voltage Vf (t) applied on the field oxide film is increased. The field oxide breakdown voltage $V_B$ is therefore reduced. Stated inversely, the breakdown voltage as determined by the charged package method for the field oxide breakdown is increased as the resistance of the input protection resistor 46 is decreased. The conventional measure of increasing the resistance of the input protection resistor 46 is in the opposite direction.

As has been described, the measure of increasing the input protection resistance in FIG. 1, leads to a larger delay in the response in the input signal and cannot be adopted to a high-speed semiconductor device. Moreover, with the larger input protection resistance, breakdown in the field oxide film can occur more easily in the charged package method.

SUMMARY OF THE INVENTION

An object of the invention is to provide a semiconductor device that has an improved dielectric breakdown voltage while avoiding the delay in the response time of the signal and the field oxide breakdown due to the reduction in the thickness of the field oxide film.

According to the invention, there is provided a semiconductor device having an external input terminal, a first insulated-gate field-effect transistor formed on a semiconductor substrate having a gate connected to the input terminal, and a second insulated-gate field effect transistor having a drain connected to the gate of the first insulated-gate field-effect transistor and having a gate and source connected to a reference voltage source, wherein the ratio W/L of the channel width W to the channel length L of the second insulated-gate field effect transistor is not less than 12.

With the semiconductor device described above, the response time τ of the protection transistor is reduced. As a result, the breakdown voltage $V_B$ as determined by the charged package method is improved as will be seen from equation (4).

The greater channel width of the protection resistor lowers the ON-resistance of the protection transistor, increases the saturation current, reduces the impedance to the Vss line after the breakdown and reduces the punch-through resistance. The smaller channel length L also reduces the impedance to the Vss line after the breakdown and reduces the punch-through resistance.

BRIEF DESCRIPTION OF THE DRAWINGS

FIG. 1 is a circuit diagram showing an insulated-gate field effect semiconductor device with protection from dielectric breakdown by electrostatic discharge at the gate insulator film at the input terminal.

FIG. 2 is a circuit diagram for explaining the human-body discharge method which is one test method for testing the electrostatic discharge of a semiconductor device.

FIG. 3 is a diagram showing an arrangement for implementing the charged package method for measuring the dielectric breakdown voltage by electrostatic discharge of the semiconductor device.

FIG. 4 shows an equivalent circuit for explaining the electrostatic discharge test by the charged package method on a semiconductor device with dielectric breakdown protection against electrostaic discharge.

FIG. 5 shows an equivalent circuit illustrating the electrostatic discharge test by the charged package method taking account of the capacitance of the field oxide film.

FIG. 7 is a diagram showing the relationship between the breakdown voltage and the response time.

DETAILED DESCRIPTION OF THE PREFERRED EMBODIMENT

A semiconductor device of an embodiment of the invention comprises a package formed of an insulator, such as a plastic material, and internal circuit components formed on a semiconductor substrate that is encapsulated by the package. The internal circuit components include first and second insulated-gate field effect transistors.

Figure 6B:
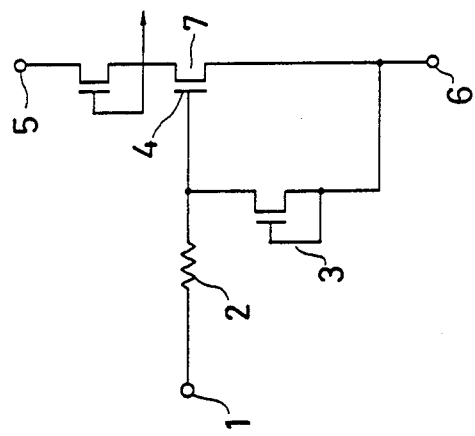
FIG. 6B is a circuit diagram showing the semiconductor device of the embodiment of FIG. 6A.
Figure 6A:
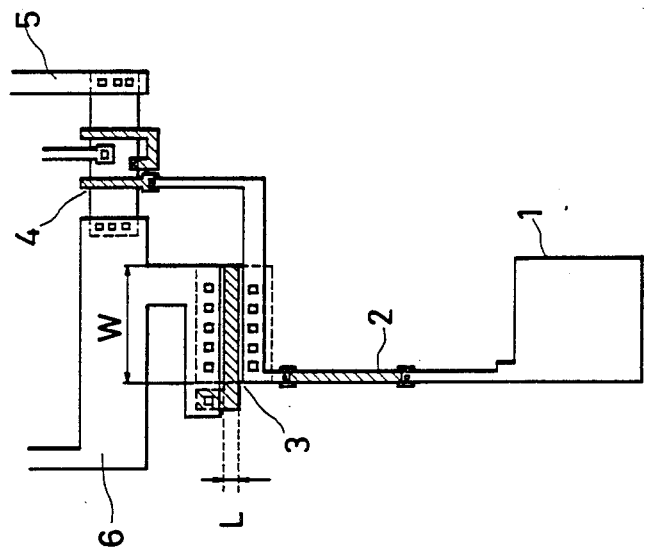
FIG. 6A is a plan pattern view showing a semiconductor device of an embodiment of the invention.

FIG. 6A is a plan pattern view showing part of the internal circuit components formed on the semiconductor substrate that are connected to an external input terminal. FIG. 6B shows an equivalent circuit of the device of FIG. 6A.

In these figures, 1 denotes an input terminal that projects from the package of the device, 2 denotes an input protection resistor formed of a polysilicon layer, 3 denotes a protection transistor, 5 denotes a power supply terminal (Vcc), and 6 denotes a Vss (GND) terminal. A transistor 7 is shown which is to be protected and which includes an input gate 4. The components 2, 3 and 7 (with 4) are formed on a semiconductor substrate. The components 1, 5 and 6 are formed partially on the semiconductor substrate and partially consist of leads.

The resistance of the protection resistor 2 is determined to prevent junction breakdown of the protection transistor 3, and is for example within the range of from about 300 Ω to about 500 Ω.

The transistor 3 is so formed that the ratio W/L of the channel width W to the channel length L is not less than 12.

The connection of the device with other external equipment for implementing the breakdown test by the charged package method is as shown in FIG. 4.

If it is assumed that the oxide breakdown occurs between the gate and drain of the protection transistor 3 or the input gate 4, the relationship between the breakdown voltage and the response time $\tau$ of the protection transistor 3 is as shown in FIG. 7, as will be seen from equation (4). It will therefore be seen that a shorter response time $\tau$ will improve the breakdown voltage $V_B$.

Figure 8:
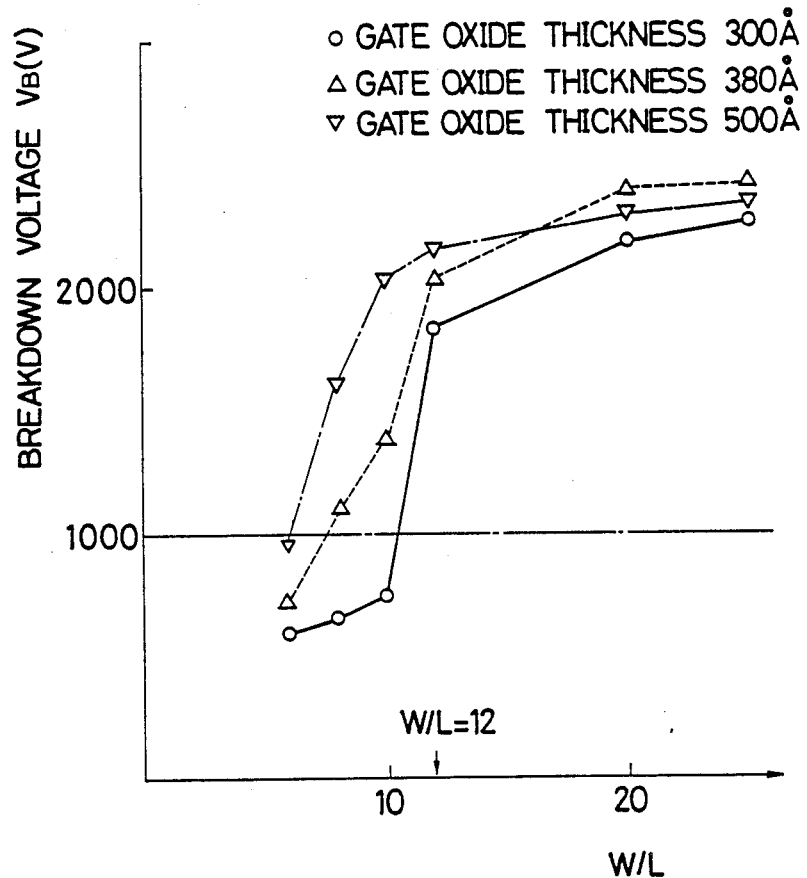
FIG. 8 is a diagram showing the relationship between the breakdown voltage and the ratio W/L of the protection transistor.

FIG. 8 shows experimental data showing the relationship between the breakdown voltage $V_B$ by the charged package method and W/L, which varies the response time $\tau$.

In the tests that were carried out, various semiconductor devices with different channel dimensions were used. One group of the devices had a channel length of 3 μm. Another group of the devices had channel length of 5 μm. These values are within the range of typical channel lengths, i.e. from 3 to 10 μm.

It will be seen from FIG. 8, that in the area where W/L is not smaller than 12, the breakdown voltage $V_B$ that causes the oxide breakdown between the gate and drain of the protection transistor 3 or at the input gate 4 of the transistor 7 is much higher than in the area where W/L is below 12. More specifically, the breakdown voltage of a 28-pin DIP plastic package devices exceeds 1000V. It is known that 28-pin DIP plastic package device with a breakdown. voltage of 800V or less as determined by the package charge method are susceptible to dielectric breakdown in the assembly line, but above 800V, the dielectric breakdown does not occur. Accordingly, with the protection arrangement of the embodiment, the breakdown voltage can be increased to a level at which no problem of dielectric breakdown occurs in the assembly line.

As was mentioned above, when the field oxide film between the input protection resistor formed of a polysilicon layer and the silicon substrate becomes thin attempts at increasing the input protection resistance to prevent oxide breakdown between the gate and drain of the protection transistor 3 and the input gate 4 of the transistor 7 fail because field oxide breakdown occurs in the test of the charged package method. This is demonstrated by FIG. 9A and FIG. 9B which show breakdown voltages of the two groups of devices having different values of input protection resistors (formed of polysilicon layers). More specifically, each of FIG. 9A and FIG. 9B indicates how many of 59 specimens had breakdown at a given voltage when the voltage is increased step by step (each step being 100V).

Figure 9B:
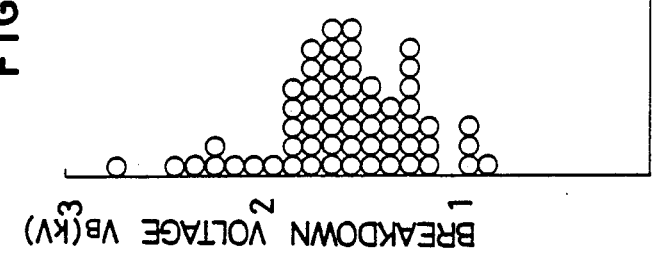
FIGS. 9A and 9B are histograms showing the effects of the resistance of the input protection resistor on the breakdown voltage.
Figure 9A:
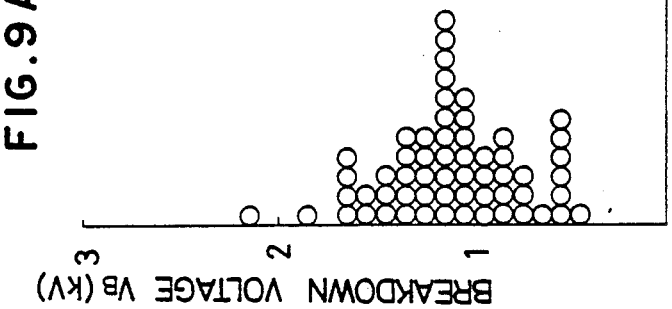

FIG. 9A shows the results when the input protection resistance was 1.5 kΩ. The resultant average $\bar{x}$ was 1164V, and the variance (that is, the square of the standard deviation)$\sigma$ was 355.1. FIG. 9B shows the results when the input protection resistance was 0.75 kΩ. The resultant average $\bar{x}$ was 1641V, and the variance $\sigma$ was 377. It will be seen from these figures that when the resistance of the input protection resistor 12 is increased (doubled) the breakdown voltage is lowered.

Figure 10:
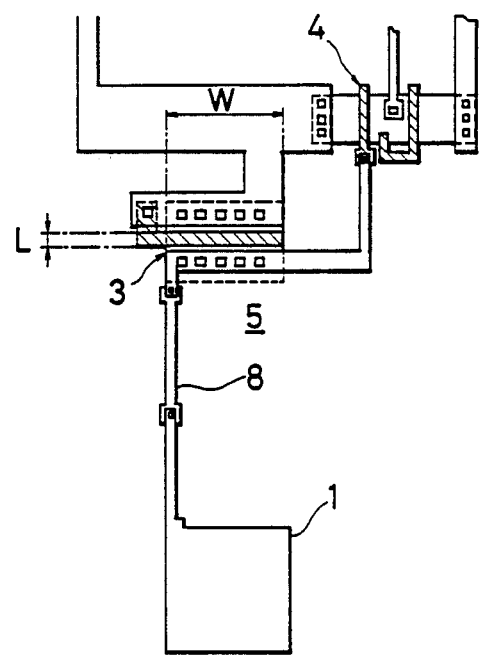
FIG. 10 is a plan pattern view of a second embodiment of the invention.

FIG. 10 is a plan pattern view showing a second embodiment of the invention. The components which are identical to those in FIG. 6A and FIG. 6B are shown with identical reference numerals. An N-type diffusion resistor is shown which is formed in the P-type silicon substrate. The protection transistor 3 is so formed that the ratio W/L of the channel width W to the channel length L is not less than 12.

Figure 11:
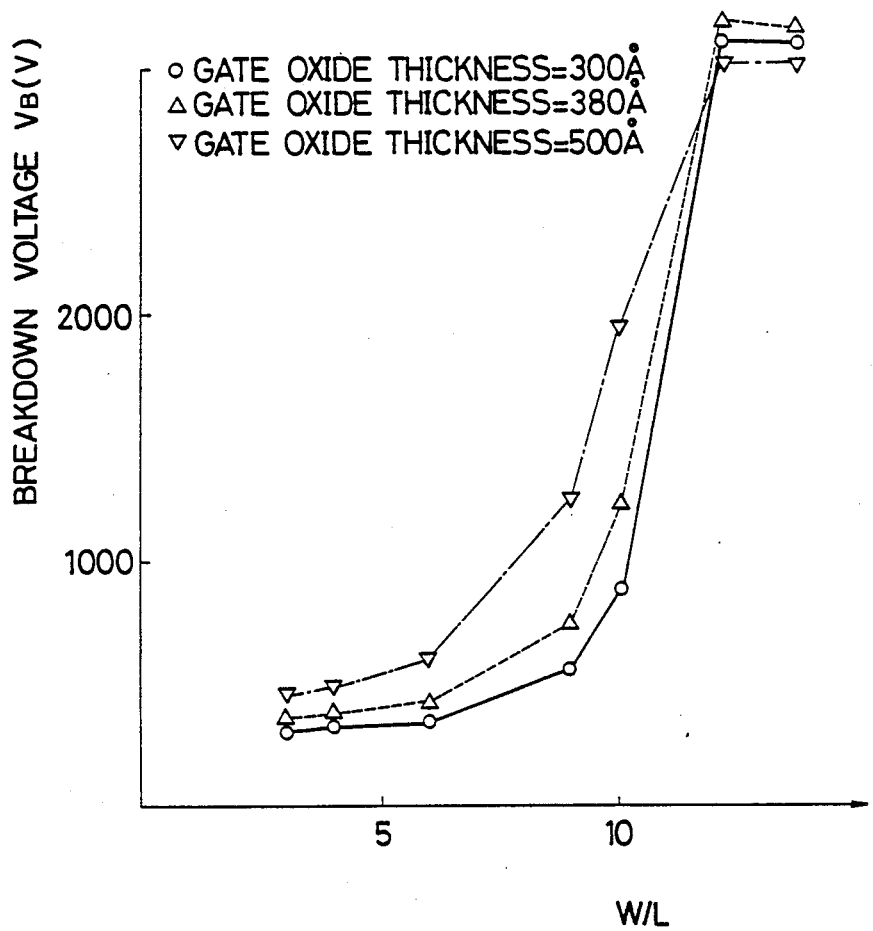
FIG. 11 is a diagram showing the relationship between the breakdown voltage and the ratio W/L of the protection transistor.

FIG. 11 shows experimental data showing the relationship between the breakdown voltage $V_B$ by the charged package method and the ratio W/L.

It will be seen from FIG. 11 that in the area where W/L is not smaller than 12, the breakdown voltage $V_B$ that causes the oxide breakdown between the gate and drain of the protection transistor 3 or at the input gate 4 of the transistor 7 is much higher than in the area where W/L is below 12, and the breakdown voltage of a 28-pin DIP plastic package device exceeds 1000V, as in to the embodiment of FIGS. 6A and 6B. Accordingly, with the protection arrangement of the above embodiment, the breakdown voltage can be increased to a level with which no problem of dielectric breakdown occurs in the assembly line. Thus similar results to those of the embodiment of FIGS. 6A and 6B are obtained.

What is claimed is:

1. A semiconductor device having:
    an external input terminal;
    a first insulated-gate field-effect transistor having a gate oxide which has a predetermined thickness and having a channel formed in a semiconductor substrate;
    a protection resistor connecting the gate of said first insulated-gate field-effect transistor to said external input terminal; and
    a second insulated-gate field-effect transistor having a gate oxide which has a thickness which is substantially the same as said predetermined thickness of said gate oxide of said first insulated field-effect transistor; said second insulated-gate field-effect transistor including a channel formed in the semiconductor substrate, a drain connected directly to the gate of said first insulated-gate field-effect transistor, a gate, and a source, said gate and said source each being connected to ground potential; wherein said channel of said second insulated-gate field-effect transistor has a channel width and a channel length, and the ratio of said channel width to said channel length is not less than 12.

2. A device according to claim 1, wherein said channel of said second insulated-gate field-effect transistor has a length which is within a range of from about 3 μm to about 10 μm.

3. A device according to claim 1, wherein said second insulated-gate field-effect transistor has a resistance in the range of from about 300 ohms to about 500 ohms.

4. A semiconductor device as claimed in claim 1, wherein the thickness of the gate oxide of said first and second insulated-gate field-effect transistors is within the range of about 300Å to about 500Å.

* * * * *